(12) United States Patent
Deak et al.

(10) Patent No.: US 12,248,035 B2
(45) Date of Patent: Mar. 11, 2025

(54) TYPE OF ROTATING DISC MAGNETIC FIELD PROBE

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 17/998,631

(22) PCT Filed: May 11, 2021

(86) PCT No.: PCT/CN2021/092974
§ 371 (c)(1),
(2) Date: Oct. 2, 2023

(87) PCT Pub. No.: WO2021/228065
PCT Pub. Date: Nov. 18, 2021

(65) Prior Publication Data
US 2024/0264250 A1     Aug. 8, 2024

(30) Foreign Application Priority Data

May 13, 2020  (CN) .......................... 202010403332.X

(51) Int. Cl.
*G01R 33/02*  (2006.01)
*G01R 33/00*  (2006.01)
*G01R 33/09*  (2006.01)

(52) U.S. Cl.
CPC ..... *G01R 33/0206* (2013.01); *G01R 33/0005* (2013.01); *G01R 33/0011* (2013.01); *G01R 33/09* (2013.01)

(58) Field of Classification Search
CPC ........ G01D 5/145; G01D 5/16; G01D 5/2451; G01D 2205/26; G01D 2205/80;
(Continued)

(56) References Cited

U.S. PATENT DOCUMENTS 6,501,268 B1 * 12/2002 Edelstein ........... G01R 33/0286
977/932
7,898,247 B2 * 3/2011 Edelstein ........... G01R 33/0029
324/244
(Continued)

FOREIGN PATENT DOCUMENTS

CN       105487027 A     4/2016
CN       108413992 A     8/2018
(Continued)

OTHER PUBLICATIONS

"Chinese Application No. 20201040332.X, Notification to Grant Patent Right for Invention dated Dec. 31, 2021", (Dec. 31, 2021), 3 pgs.
(Continued)

*Primary Examiner* — Steven L Yeninas
(74) *Attorney, Agent, or Firm* — Schwegman Lundberg & Woessner, P.A.

(57) ABSTRACT

A type of rotating disk magnetic field probe (1) comprising: a non-magnetic rotating disk (2), 4N first soft ferromagnetic sectors (3), M second soft ferromagnetic sectors (4), a reference signal generator, an X-axis magnetoresistive sensor (7, 8), a Y-axis magnetoresistive sensor (5,6), and a Z-axis magnetoresistive sensor (9). Both the first soft ferromagnetic sectors (3) and the second soft ferromagnetic sector (4) are located on the non-magnetic rotating disk (2). In operation, the non-magnetic rotating disk (2) rotates about a Z-axis at a frequency f. An external magnetic field is modulated by the first soft ferromagnetic sector (3) into an X-axis magnetic field sensed component and a Y-axis mag-
(Continued)

netic field sensed component having a frequency of 4N×f, and is modulated by the second soft ferromagnetic field sectors into a Z-axis magnetic field sensed component having a frequency of M×f. The X-axis sensed magnetic field component, the Y-axis sensed magnetic field component, and the Z-axis sensed magnetic field component respectively are converted into output signals by means of the X-axis magnetoresistive sensor (7, 8) the Y-axis magnetoresistive sensor (5, 6) and the Z-axis magnetoresistive sensor (9). The reference signal generator respectively outputs a first reference signal having a frequency of 4N×f and a second reference signal having a frequency of M×f. The first reference signal, the second reference signal, and the measurement signals are demodulated by an external processing circuit to output magnetic field values Hx, Hy and Hz.

12 Claims, 7 Drawing Sheets

(58) Field of Classification Search
CPC .......... G01B 7/30; G01P 3/487; H02K 29/08; H02K 11/215; G01R 33/02; G01R 33/09; G01R 33/0206; G01R 33/0041
See application file for complete search history.

(56) References Cited

U.S. PATENT DOCUMENTS

| 2010/0231211 A1 | 9/2010 | Edelstein et al. |
| 2011/0062956 A1 | 3/2011 | Edelstein |

FOREIGN PATENT DOCUMENTS

| CN | 108414951 A | 8/2018 |
| CN | 110873851 A | 3/2020 |
| CN | 111537924 A | 8/2020 |

OTHER PUBLICATIONS

"Chinese Application No. 202010403332.X, First Office Action dated Aug. 4, 2021", (Aug. 4, 2021), 9 pgs.
"Chinese Application No. 202010403332.X, Search Report dated Jul. 28, 2021", (Jul. 28, 2021), 2 pgs.
"International Application No. PCT/CN2021/092974, International Search Report and Written Opinion mailed Aug. 2, 2021", (Aug. 2, 2021), 12 pgs.

\* cited by examiner

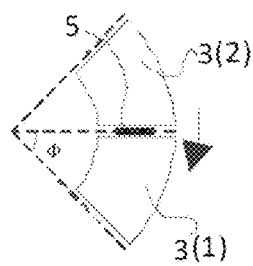
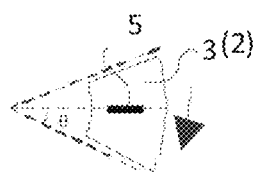
FIG. 5a    FIG. 5b
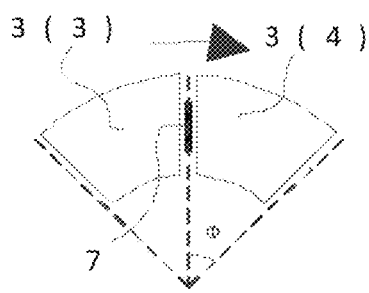
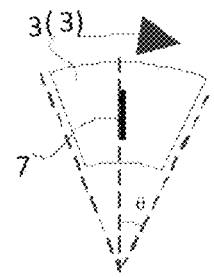
FIG. 6a    FIG. 6b
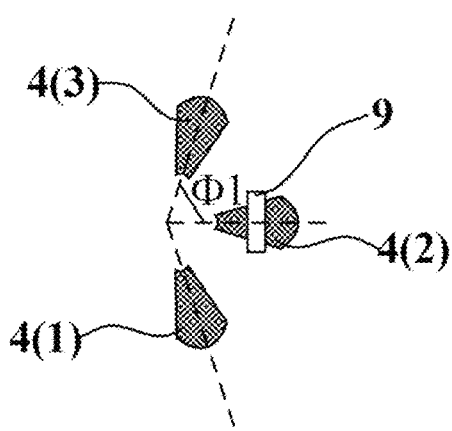
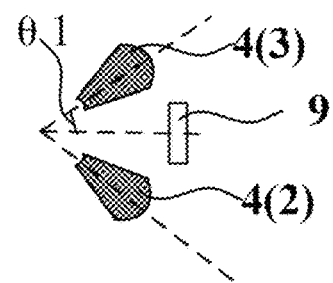
FIG. 7a    FIG. 7b

TYPE OF ROTATING DISC MAGNETIC FIELD PROBE

PRIORITY CLAIM TO RELATED APPLICATIONS

This application is a U.S. national stage filing under 35 U.S.C. § 371 from International Application No. PCT/CN2021/092974, filed on 11 May 2021, and published as WO2021/228065 on 18 Nov. 2021, which claims the benefit under 35 U.S.C. 119 to Chinese Application No. 202010403332.X, filed on 13 May 2020, the benefit of priority of each of which is claimed herein, and which applications and publication are hereby incorporated herein by reference in their entirety.

TECHNICAL FIELD

This embodiment of the present invention relates to magnetoresistive sensor technologies, and in particular, to a type of rotating disk magnetic field probe.

BACKGROUND ART

Magnetoresistive sensors have 1/f noise. Reducing the noise of magnetoresistive sensors and developing a low noise magnetoresistive sensor are of great significance in improving the accurate measurement of magnetic signals.

In general, magnetoresistive sensors have high 1/f noise at a low frequency, while thermal noise is dominates at a high-frequency, but its noise energy density is much lower than that of the 1/f noise at the low frequency. Therefore, at present, it is common to modulate a magnetic signal into a higher frequency magnetic field, which is then measured by a magnetoresistive sensor to output a high-frequency voltage signal. The high frequency voltage signal is then demodulated, for the purpose of moving magnetic signal measurement from a low-frequency part of the spectrum to a high-frequency part of the spectrum, thereby reducing 1/f noise energy density.

However, existing high-frequency magnetic signal measuring apparatuses greatly increase the complexity and size of a magnetoresistive sensor, as well as the complexity of the manufacturing process.

The U.S. Pat. No. 365,398 discloses a magnetoresistive sensor method and apparatus for modulating magnetic flux sensed by a magnetic sensor. The present application includes at least one magnetic sensor attached to a base structure, a rotating member, and at least one flux concentrator mounted on the rotating member. With the rotation of the rotating member, the at least one magnetic flux concentrator periodically shields the magnetic sensor. Thus, the output of the at least one magnetic sensor will be modulated. The present application uses a TMR sensor chip to realize a two-axis sensor, which has a complex structure and large size.

SUMMARY OF THE INVENTION

The embodiments of the present invention provide a type of rotating disk magnetic field probe to solve the problem of measurement system complexity.

The embodiments of the present invention provide a type of rotating disk magnetic field probe, including:

a non-magnetic rotating disk, 4N first soft ferromagnetic sectors, and M second soft ferromagnetic sectors. Both the first soft ferromagnetic sectors and the second soft ferromagnetic sectors are located on the non-magnetic rotating disk. Cylindrical coordinates of the 4N first soft ferromagnetic sectors are respectively $(r[r_1,r_2], \alpha[\Phi_0,90°/N-\Phi_0], z[z_0,z_0+th_1])$, $(r[r_1,r_2], \alpha[\Phi_0+90°/N, 2\times90°/N-\Phi_0], z[z_0,z_0+th_1])$, $(r[r_1,r_2], \alpha[\Phi_0+(i-1)\times90°/N, i\times90°/N-\Phi_0], z[z_0,z_0+th_1])$ and $(r[r_1,r_2], \alpha[\Phi_0+(4N-1)\times90°/N, 4N\times90°/N-\Phi_0], z[z_0,z_0+th_1])$, and cylindrical coordinates of the M second soft ferromagnetic sectors are respectively $(r[r_3,r_4], \alpha[\Phi_1,360°/M-\Phi_1], z[z_1,z_1+th_3])$, $(r[r_3,r_4], \alpha[\Phi_1+360°/M, 2\times360°/M-\Phi_1], z[z_1,z_1+th_3])$, $(r[r_3,r_4], \alpha[\Phi_1+(i-1)\times360°/M, i\times360°/M-\Phi_1], z[z_1,z_1+th_3])$ and $(r[r_3,r_4], \alpha[\Phi_1+(M-1)\times360°/M, M\times360°/M-\Phi_1], z[z_1,z_1+th_3])$;

a Y-axis magnetoresistive sensor at cylindrical coordinates $(r(r=(r_1+r_2)/2), \alpha(\alpha=0°\&180°), z[(z=z_0-th_2)|(z=z_0+th_1+th_2)])$;

an X-axis magnetoresistive sensor at cylindrical coordinates $(r(r=(r_1+r_2)/2), \alpha(\alpha=90°\&270°), z[(z=z_0-th_2)|(z=z_0+th_1+th_2)])$;

a Z-axis magnetoresistive sensor at cylindrical coordinates $(r(r=(r_3+r_4)/2), \alpha[(\alpha=180°/M)|(\alpha=3\times180°/M)| \ldots |(\alpha=(2i-1)\times180°/M)| \ldots |(\alpha=(2M-1)\times360°/M)|(\alpha=(M-1)\times360°/M)], z[(z=z_1-th_4)|(z=z_1+th_3+th_4)])$;

and a reference signal generator, wherein both 4N/M and M/4N are non-integers.

In operation, the non-magnetic rotating disk rotates about a z-axis at a frequency f. An external magnetic field H is modulated by the first soft ferromagnetic sector into magnetic field sensed components Hx and Hy having a frequency of 4N×f, and the external magnetic field H is further modulated by the second soft ferromagnetic sector into a magnetic field sensed component Hz having a frequency of M×f. The three magnetic field sensed components Hx, Hy, and Hz are converted into output signals by means of the X-axis, Y-axis and Z-axis magnetoresistive sensors, respectively. The reference signal generator respectively outputs a first reference signal having a frequency of 4N×f and a second reference signal having a frequency of M×f. The first reference signal, the second reference signal, and the measurement signals are demodulated by an external processing circuit to output magnetic field values Hx, Hy, and Hz, so as to measure a three-dimensional magnetic field signal with high signal to noise ratio.

In the embodiment of the present invention, the type of rotating disk magnetic field probe includes a non-magnetic rotating disk, 4N first soft ferromagnetic sectors, M second soft ferromagnetic sectors, a reference signal generator, and X-axis, Y-axis and Z-axis magnetoresistive sensors. Both the first soft ferromagnetic sectors and the second soft ferromagnetic sectors are located on the non-magnetic rotating disk, and the X-axis, Y-axis and Z-axis magnetoresistive sensors are located above or below the non-magnetic rotating disk. In the embodiment of the present invention, the type of rotating disk magnetic field probe modulates a static magnetic field into a high-frequency magnetic field, and measures in the high-frequency magnetic field, which can effectively overcome noise caused by a DC offset of a TMR magnetoresistive sensor, eliminate the influence of the DC offset, and greatly reduce the noise during use of the TMR magnetoresistive sensor. Moreover, the measurement structure is simple in manufacturing method, which can be realized by adding a rotating soft ferromagnetic probe to the magnetoresistive sensor, thereby reducing the complexity and size of the measurement structure. The measurement structure is valuable for monitoring the geomagnetic field and improving the signal-to-noise ratio.

BRIEF DESCRIPTION OF THE DRAWINGS

In order to more clearly explain the embodiments of the present invention or the technical solutions in the prior art, accompanying drawings that need to be used in the description of the embodiments of the prior art will be briefly introduced below. Obviously, although the accompanying drawings in the following description are some specific embodiments of the present invention, for those skilled in the art, they may be expanded and extended to other structures and drawings according to basic concepts of the device structures, the driving method, and the manufacturing method disclosed according to the various embodiments of the present invention, which undoubtedly fall within the scope of claims of the present invention.

FIG. 5a is a diagram of a location of a maximum value of an induced magnetic field of a Y-axis magnetoresistive sensor;

FIG. 5b is a diagram of a location of a minimum value of an induced magnetic field of a Y-axis magnetoresistive sensor;

FIG. 6a is a diagram of a location of a maximum value of an induced magnetic field of an X-axis magnetoresistive sensor;

FIG. 6b is a diagram of a location of a minimum value of an induced magnetic field of an X-axis magnetoresistive sensor;

FIG. 7a is a diagram of a location of a maximum value of an induced magnetic field of a Z-axis magnetoresistive sensor;

FIG. 7b is a diagram of a location of a minimum value of an induced magnetic field of a Z-axis magnetoresistive sensor;

DETAILED DESCRIPTION

In order to make the objectives, technical solutions, and advantages of the present disclosure clearer, the technical solutions of the present disclosure will be described clearly and completely through the implementation manners below with reference to the accompanying drawings in the embodiments of the present disclosure. Obviously, the described embodiments are some embodiments but not all embodiments of the present disclosure. Based on basic concepts disclosed and prompted by the embodiments in the present invention, all other embodiments obtained by those skilled in the art belong to the protection scope of the present invention.

Figure 1:
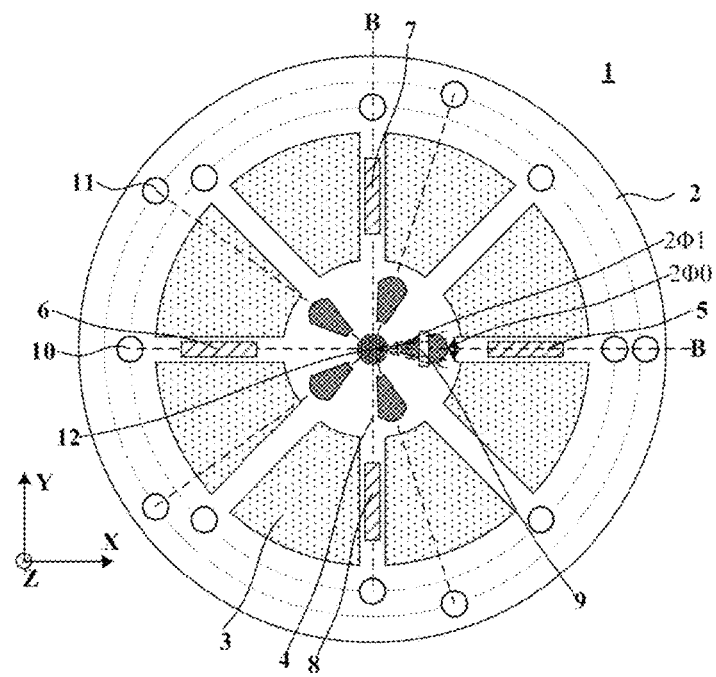
FIG. 1 is a schematic diagram of a type of rotating disk magnetic field probe according to an embodiment of the present invention.
Figure 2:
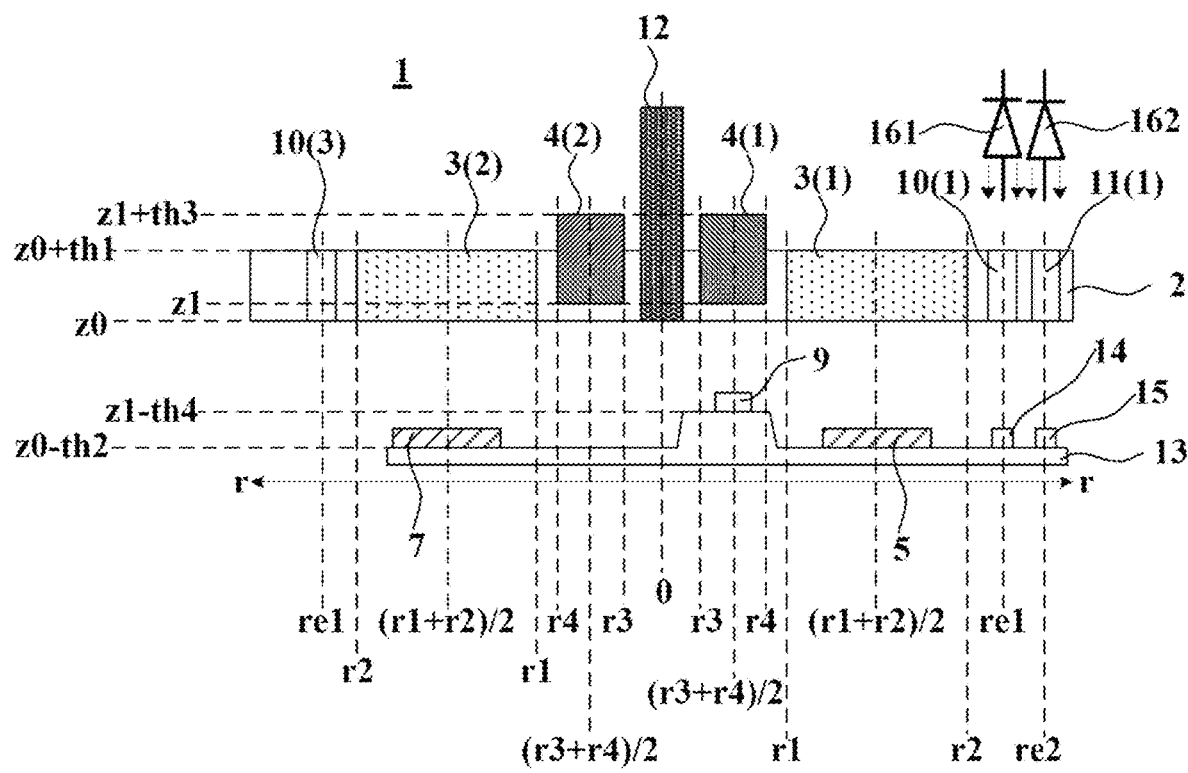
FIG. 2 is a sectional view of FIG. 1 along B-B.
Figure 3:
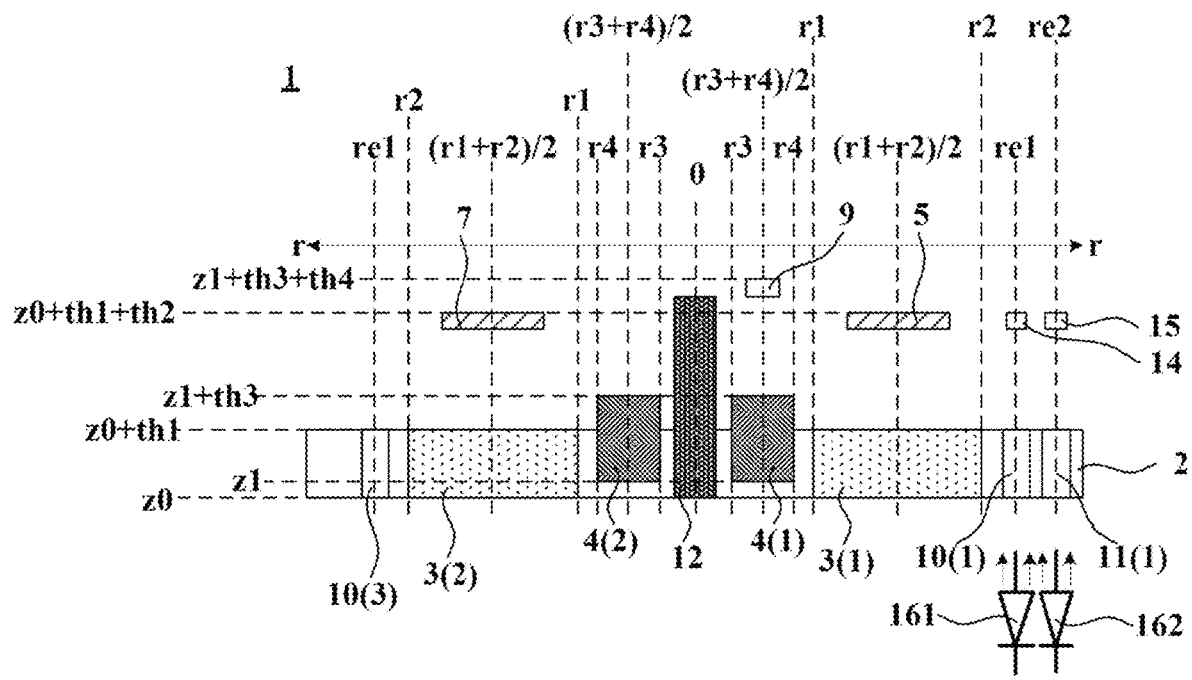
FIG. 3 is a sectional view of FIG. 1 along B-B.
Figure 4:
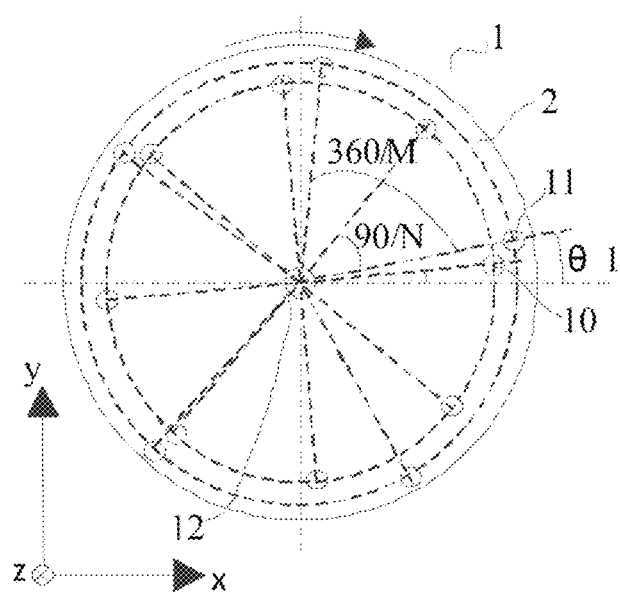
FIG. 4 is a schematic diagram of rotation of FIG. 1.

Referring to FIG. 1, a schematic diagram of a type of rotating disk magnetic field probe according to an embodiment of the present invention is shown. FIG. 2 is a sectional view of FIG. 1 along B-B, FIG. 3 is a sectional view of FIG. 1 along B-B; and FIG. 4 is a schematic diagram of rotation of FIG. 1. The type of rotating disk magnetic field probe 1 includes a non-magnetic rotating disk 2, 4N first soft ferromagnetic sectors 3 and M second soft ferromagnetic sectors 4. Both the first soft ferromagnetic sectors 3 and the second soft ferromagnetic sectors 4 are located on the non-magnetic rotating disk 2. Cylindrical coordinates of the 4N first soft ferromagnetic sectors 3 are respectively $(r[r_1,r_2], \alpha[\Phi_0,90°/N-(\Phi_0)], z[z_0,z_0+th_1])$, $(r[r_1,r_2], \alpha[\Phi_0+90°/N,2\times90°/N-(\Phi_0)], z[z_0,z_0+th_1])$, $(r[r_1,r_2], \alpha[\Phi_0+(i-1)\times90°/N,i\times90°/N-\Phi_0], z[z_0,z_0+th_1])$ and $(r[r_1,r_2], \alpha[\Phi_0+(4N-1)\times90°/N,4N\times90°/N-\Phi_0], z[z_0,z_0+th_1])$, and cylindrical coordinates of the M second soft ferromagnetic sector 4 are respectively $(r[r_3,r_4], \alpha[\Phi_1,360°/M-\Phi_1], z[z_1,z_1+th_3])$, $(r[r_3,r_4], \alpha[\Phi_1+360°/M,2\times360°/M-\Phi_1], z[z_1,z_1+th_3])$, $(r[r_3,r_4], \alpha[\Phi_0+(i-1)\times360°/M,i\times360°/M-\Phi_1], z[z_1,z_1+th_3])$ and $(r[r_3,r_4], \alpha[\Phi_1+(M-1)\times360°/M,M\times360°/M-\Phi_1], z[z_1,z_1+th_3])$; Y-axis magnetoresistive sensors 5 and 6 at cylindrical coordinates $(r(r=(r_1+r_2)/2), \alpha(\alpha=0°\&180°), z[(z=z_0-th_2)|(z=z_0+th_1+th_2)])$; X-axis magnetoresistive sensor 7 and 8 at cylindrical coordinates $(r(r=(r_1+r_2)/2), \alpha(\alpha=90°\&270°), z[(z=z_0-th_2)|(z=z_0+th_1+th_2)])$; a Z-axis magnetoresistive sensor 9 at cylindrical coordinates $(r(r=(r_3+r_4)/2),\alpha[(\alpha=180°/M)|(\alpha=3\times180°/M)| \ldots |(\alpha=(2i-1)\times180°/M)| \ldots |(\alpha=(2M-1)\times360°/M)|(\alpha=(M-1)\times360°/M)],z[(z=z_1-th_4)|(z=z_1+th_3+th_4)])$; and a reference signal generator, wherein both 4N/M and M/4N are non-integers.

In operation, the non-magnetic rotating disk 2 rotates about a z-axis at a frequency f. An external magnetic field H is modulated by the first soft ferromagnetic sector 3 into magnetic field sensed components Hx and Hy having a frequency of 4N×f, and the external magnetic field H is further modulated by the second soft ferromagnetic sector 4 into a magnetic field sensed component Hz having a frequency of M×f. The three magnetic field sensed components Hx, Hy, and Hz are converted into output signals by means of the X-axis, Y-axis and Z-axis magnetoresistive sensors, respectively. The reference signal generator respectively outputs a first reference signal having a frequency of 4N×f and a second reference signal having a frequency of M×f. The first reference signal, the second reference signal, and the measurement signals are demodulated by an external processing circuit to output magnetic field values Hx, Hy, and Hz, so as to measure a high signal-to-noise ratio of a three-dimensional magnetic field signal.

In this embodiment, the non-magnetic rotating disk 2 has a circular structure with a certain thickness, and optionally may be a cylinder substrate with a small thickness. An xyz coordinate system is established by taking a central axis of the non-magnetic rotating disk 2 as a z=0 axis, where a plane composed of an X-axis and a Y-axis is parallel to upper and lower surfaces of the non-magnetic rotating disk 2, and the Z-axis direction is perpendicular to the surface of the non-magnetic rotating disk 2, that is, parallel to the thickness direction of the non-magnetic rotating disk 2. Optionally, the z coordinate of the lower surface of the non-magnetic disk 2 is $z=z_0$, and the thickness of the non-magnetic rotating disk 2 is $th_1$, then the z coordinate of its upper surface is $z=z_0+th_1$. The z coordinate of the device below the lower surface of the non-magnetic rotating disk 2 is less than $z_0$, and the z coordinate of the device above the upper surface of the non-magnetic rotating disk 2 is greater than $z_0+th1$. A coordinate point of the device in the type of rotating disk magnetic field probe 1 is represented by cylindrical coordinates (r, α, z), where r represents a vertical distance with the z-axis, and a represents an included angle between a projection of r on the X-Y plane and the X-axis. Optionally, the non-magnetic rotating disk 2 may be made of any non-magnetic material such as plastic, ceramic, metal, or polymer.

In this embodiment, the 4N first soft ferromagnetic sectors 3 are located on the non-magnetic rotating disk 2. Assuming N=2, the non-magnetic rotating disk 2 as shown in FIG. 1 has 8 first soft ferromagnetic sectors 3, which are 3(1) to 3(8) respectively. In the original state, a first soft ferromagnetic sector 3 in a first quadrant of the xy coordinate next to the +X-axis is marked as 3(1), and the remaining 7 sectors are marked as 3(2) to 3(8) counterclockwise sequentially. It is understandable that with the rotation of the non-magnetic rotating disk 2, 3(1) will rotate to different positions. The cylindrical coordinates of the 8 first soft ferromagnetic sectors 3 are respectively $(r[r_1,r_2], \alpha[\Phi_0,45°-\Phi_0], z[z_0,z_0+th_1])$, $(r[r_1,r_2], \alpha[\Phi_0+45°, 90°-\Phi_0], z[z_0,z_0+th_1])$, $(r[r_1,r_2], \alpha[\Phi_0+90°, 135°-\Phi_0], z[z_0,z_0+th_1])$, $(r[r_1,r_2], \alpha[\Phi_0+135°, 180°-\Phi_0], z[z_0,z_0+th_1])$, $(r[r_1,r_2], \alpha[\Phi_0+180°, 225°-\Phi_0],z[z_0,z_0+th_1])$, $(r[r_1,r_2], \alpha[\Phi_0+225°,270°-\Phi_0], z[z_0,z_0+th_1])$, $(r[r_1,r_2], \alpha[\Phi_0+270°,315°-\Phi_0], z[z_0,z_0+th_1])$, and $(r[r_1,r_2], \alpha[\Phi_0+315°,360°-\Phi_0],z[z_0,z_0+th_1])$. It is understandable that in other embodiments, optionally, N=1 or N is a positive integer greater than or equal to 3.

The cylindrical coordinates of one first soft ferromagnetic sector 3 of the 4N first soft ferromagnetic sector 3 are $(r[r_1,r_2], \alpha[\Phi_0,45°-\Phi_0], z[z_0,z_0+th_1])$, indicating that the first soft ferromagnetic sector 3 is located in the non-magnetic rotating disk 2, the upper surface of the first soft ferromagnetic sector 3 is superposed with the upper surface of the non-magnetic rotating disk 2, the lower surface of the first soft ferromagnetic sector 3 is superposed with the lower surface of the non-magnetic rotating disk 2, the thickness of the first soft ferromagnetic sector 3 is equal to the thickness of the non-magnetic rotating disk 2, and the first soft ferromagnetic sector 3 is enclosed by two radius lines and two arcs, where an included angle between one radius line and the x-axis is $\Phi_0$ and an included angle between the other radius line and the x-axis is $45°-\Phi_0$, one arc is located on a circle with a radius $r_2$ and the other arc is located on a circle with a radius $r_1$. Optionally, an included angle between the two radius lines of the first soft ferromagnetic sector 3 is less than 90°.

In this embodiment, the M second soft ferromagnetic sectors 4 are located on the non-magnetic rotating disk 2. Assuming M=5, the non-magnetic rotating disk 2 as shown in FIG. 1 has 5 second soft ferromagnetic sectors 4, which are 4(1) to 4(5) respectively. In the original state, a second soft ferromagnetic sector 4 in a first quadrant of the xy coordinate next to the +X-axis is marked as 4(1), and the remaining four sectors are marked as 4(2) to 4(5) counterclockwise sequentially. It is understandable that with the rotation of the non-magnetic rotating disk 2, 4(1) will rotate to different positions. The cylindrical coordinates of the 5 second soft ferromagnetic sectors 4 are respectively $(r[r_3,r_4], \alpha[\Phi_1,72°-\Phi_1], z[z_1,z_1+th_3])$, $(r[r_3,r_4], \alpha[\Phi_1+72°,144°-\Phi_1], z[z_1,z_1+th_3])$, $(r[r_3,r_4], \alpha[\Phi_1+144°,216°-\Phi_1], z[z_1,z_1+th_3])$, $(r[r_3,r_4], \alpha[\Phi_1+216°,288°-\Phi_1], z[z_1,z_1+th_3])$, and $(r[r_3,r_4], \alpha[\Phi_1+288°,360°-\Phi_1], z[z_1,z_1+th_3])$. It is understandable that N and M are integers, but 4N/M is not an integer and M/4N is not an integer. In other embodiments, optionally, M=3, or a positive integer M may be reasonably selected after N is determined.

Optionally, the type of rotating disk magnetic field probe 1 further includes two X-axis magnetoresistive sensors 7 and 8, two Y-axis magnetoresistive sensors 5 and 6, and a Z-axis magnetoresistive sensor 9. Optionally, the Y-axis magnetoresistive sensor 5 is located at α=0° position, the Y-axis magnetoresistive sensor 6 is located at α=180° position, the X-axis magnetoresistive sensor 7 is located at α=90° position, and the X-axis magnetoresistive sensor 8 is located at α=270° position.

In this embodiment, optionally, the X-axis, Y-axis, and Z-axis magnetoresistive sensors are all located below the non-magnetic rotating disk 2.

The cylindrical coordinates of the Y-axis magnetoresistive sensor 5 are $(r(r=(r_1+r_2)/2), \alpha(\alpha=0°), z(z=z_0-th_2))$, the cylindrical coordinates of the Y-axis magnetoresistive sensor 6 are $(r(r=(r_1+r_2)/2), \alpha(\alpha=180°), z(z=z_0-th_2))$, the cylindrical coordinates of the X-axis magnetoresistive sensor 7 are $(r(r=(r_1+r_2)/2), \alpha(\alpha=90°), z(z=z_0-th_2))$, the cylindrical coordinates of the X-axis magnetoresistive sensor 8 are $(r(r=(r_1+r_2)/2), \alpha(\alpha=270°), z(z=z_0-th_2))$, and the cylindrical coordinates of Z-axis magnetoresistive sensor 9 are $(r(r=(r_3+r_4)/2), \alpha(\alpha=180°/M), z(z=z_1-th_4))$.

In other embodiments, as shown in FIG. 3, optionally, the X-axis, Y-axis, and Z-axis magnetoresistive sensors may all be located above the non-magnetic rotating disk 2. The cylindrical coordinates of the Y-axis magnetoresistive sensor 5 are $(r(r=(r_1+r_2)/2), \alpha(\alpha=0°), z(z=z_0+th_1+th_2))$, the cylindrical coordinates of the Y-axis magnetoresistive sensor 6 are $(r(r=(r_1+r_2)/2), \alpha(\alpha=180°), z(z=z_0+th_1+th_2))$, the cylindrical coordinates of the X-axis magnetoresistive sensor 7 are $(r(r=(r_1+r_2)/2), \alpha(\alpha=90°), z(z=z_0+th_1+th_2))$, the cylindrical coordinates of the X-axis magnetoresistive sensor 8 are $(r(r=(r_1+r_2)/2), \alpha(\alpha=270°), z(z=z_0+th_1+th_2))$, and the cylindrical coordinates of the Z-axis magnetoresistive sensor 9 are $(r(r=(r_3+r_4)/2), \alpha(\alpha=180°/M), z(z=z_1-th_4))$.

In other embodiments, optionally, the cylindrical coordinates of the Z-axis magnetoresistive sensor may also be $(r(r=(r_3+r_4)/2), \alpha(\alpha=3\times180°/M), z(z=z_1-th_4))$, or $(r(r=(r_3+r_4)/2), \alpha(\alpha=5\times80°/M), z(z=z_1-th_4))$, or $(r(r=(r_3+r_4)/2), \alpha(\alpha=7\times180°/M), z(z=z_1-th_4))$, or $(r(r=(r_3+r_4)/2), \alpha(\alpha=9\times180°/M), z(z=z_1-th_4))$.

It is understandable that $z_0$ and $z_1$ are both greater than or equal to 0, $th_1$, $th_2$, $th_3$, and $th_4$ are all greater than 0, $z_0$ and $z_1$ may be equal or unequal, and any two values in $th_1$, $th_2$, $th_3$, and $th_4$ may be equal or unequal. No specific definition is made in the present invention. On the basis of not affecting the operation of the type of rotating disk magnetic field probe, relevant practitioners may reasonably set the plurality of values.

In this embodiment, the type of rotating disk magnetic field probe 1 further includes a reference signal generator and a rotating shaft 12. Optionally, a rotating direction of the rotating shaft 12 is clockwise as shown in an arrow direction in FIG. 4.

In operation, the rotating shaft 12 rotates at the frequency f to synchronously drive the non-magnetic rotating disk 2 to rotate about the z-axis at the frequency f. The three-dimensional external magnetic field H is modulated by the first soft ferromagnetic sector 3 into the magnetic field sensed components Hx and Hy having the frequency of 4N×f, and the three-dimensional external magnetic field H is further modulated by the second soft ferromagnetic sector 4 into the magnetic field sensed component Hz having the frequency of M×f. The magnetic field sensed component Hx is measured by the X-axis magnetoresistive sensors 7 and 8 respectively and X-axis measurement signals are output. The magnetic field sensed component Hy is measured by the Y-axis magnetoresistive sensors 5 and 6 respectively and Y-axis measurement signals are output. The magnetic field sensed component Hz is measured by the Z-axis magnetoresistive sensor 9 and a Z-axis measurement signal is output. The reference signal generator outputs the first reference signal having the frequency of 4N×f and the second reference signal having the frequency of M×f. The first reference signal, the second reference signal, and the X-axis, Y-axis and Z-axis measurement signals are all output to the external processing circuit. The external processing circuit demodulates the received reference signals and measurement signals to obtain Hx, Hy, and Hz values and output the three magnetic field values, so as to measure a high signal-to-noise ratio of the magnetic field signal of the three-dimensional external magnetic field H.

As shown in FIG. 5a and FIG. 5b, schematic measurement diagrams of the Y-axis magnetoresistive sensor are shown. FIG. 5a shows a location of a maximum value of an induced magnetic field. At this time, a positive projection of the Y-axis magnetoresistive sensor 5 on the non-magnetic rotating disk 2 is located in a gap between two adjacent first soft ferromagnetic sectors 3(1) and 3(2). The amplitude of the induced magnetic field in the Y-direction is the largest, and a span radian angle of a single sector is Φ. FIG. 5b shows a location of a minimum value of the induced magnetic field, and at this time, a rotation angle of the first soft ferromagnetic sector 3(2) is θ=Φ/2. The positive projection of the Y-axis magnetoresistive sensor 5 on the non-magnetic rotating disk 2 is located in the middle of the first soft ferromagnetic sector 3(2). The magnetic field shielding effect is the largest, and therefore, the amplitude of the induced magnetic field in the Y-direction is the smallest.

As shown in FIG. 6a and FIG. 6b, schematic measurement diagrams of the X-axis magnetoresistive sensor are shown. FIG. 6a shows a location of a maximum value of an induced magnetic field. At this time, a positive projection of the X-axis magnetoresistive sensor 7 on the non-magnetic rotating disk 2 is located in a gap between two adjacent first soft ferromagnetic sectors 3(3) and 3(4). The amplitude of the induced magnetic field in the X-direction is the largest, and a span radian of a single sector is Φ. FIG. 6b shows a location of a minimum value of the induced magnetic field, and at this time, a rotation angle of the first soft ferromagnetic sector 3(3) is θ=Φ/2. The positive projection of the X-axis magnetoresistive sensor 7 on the non-magnetic rotating disk 2 is located in the middle of the first soft ferromagnetic sector 3(3). The magnetic field shielding effect is the largest, and therefore, the amplitude of the induced magnetic field in the X-direction is the smallest.

As shown in FIG. 7a and FIG. 7b, schematic measurement diagrams of the Z-axis magnetoresistive sensor are shown. FIG. 7a shows a location of a maximum value of an induced magnetic field. At this time, a positive projection of the Z-axis magnetoresistive sensor 9 on the non-magnetic rotating disk 2 is located directly below or above one of the second soft ferromagnetic sectors 4(2). The amplitude of the induced magnetic field in the Z-direction is the largest, and a span radian of a single sector is Φ1. FIG. 7b shows a location of a minimum value of the induced magnetic field, and at this time, a rotation angle of the second magnetic sector 4(2) is θ1=Φ1/2. The positive projection of the Z-axis magnetoresistive sensor 9 on the non-magnetic rotating disk 2 is located in a gap between two adjacent second soft ferromagnetic sectors 4(2) and 4(3). The magnetic field shielding effect is the largest, and therefore, the amplitude of the induced magnetic field in the Z-direction is the smallest.

Figure 8A:
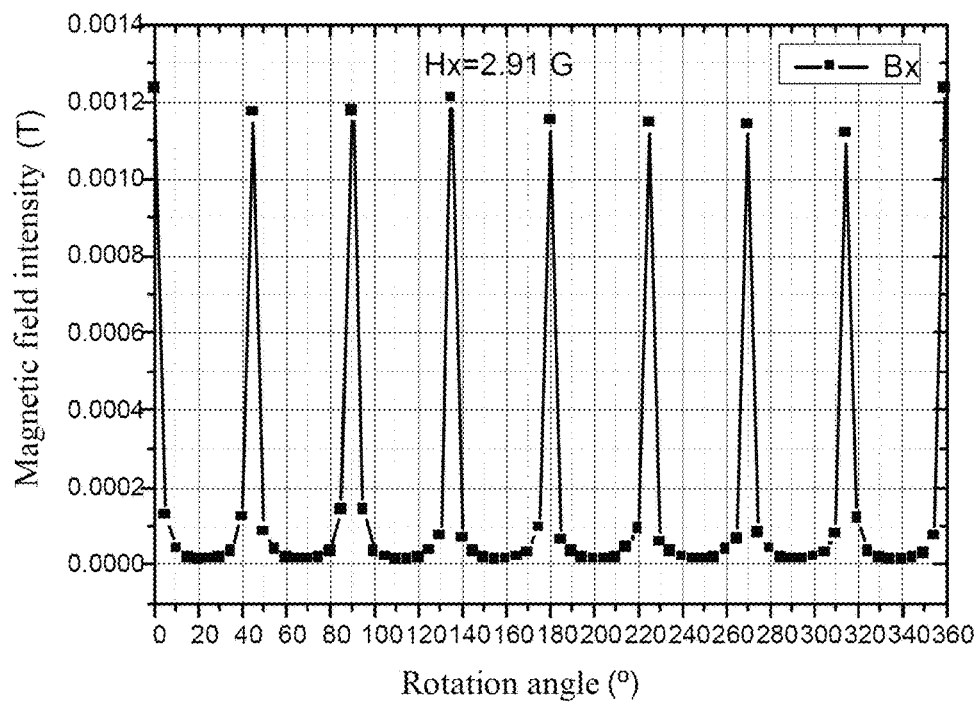
FIG. 8a is a diagram of an induced magnetic field intensity of an X-axis magnetoresistive sensor varying with a rotation angle of a non-magnetic rotating disk under an X-axis unidirectional magnetic field.

As shown in FIG. 8a, it is a diagram of an induced magnetic field intensity of an X-axis magnetoresistive sensor varying with a rotation angle of a non-magnetic rotating disk under an X-axis unidirectional magnetic field. As can be seen, in a rotation angle range of 0°-360°, an X-axis magnetoresistive sensor signal varies periodically at a period of 45°. In this embodiment, it is selected that there are 8 first soft ferromagnetic sectors 3 in the range of 0°-360°, with a span of 45°. Therefore, assuming that a rotating frequency of the non-magnetic rotating disk is f, the frequency of the X-axis magnetoresistive sensor is 8*f.

At the same time, it can be seen that variations in the induced magnetic field intensity of the Y-axis magnetoresistive sensor along with the angle of the non-magnetic rotating disk under the condition of the Y-axis unidirectional magnetic field are consistent with variations in the magnetic field intensity of the X-axis magnetoresistive sensor along with the rotation angle of the non-magnetic rotating disk under the condition of the X-axis unidirectional magnetic field, and a result thereof is similar to that in FIG. 8a.

Figure 8B:
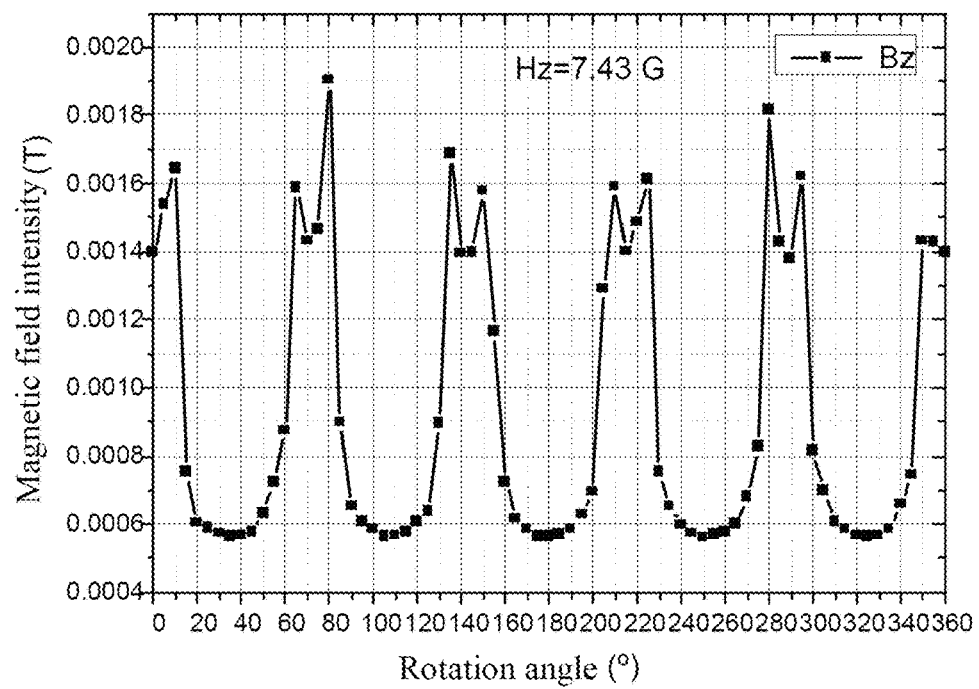
FIG. 8b is a diagram of an induced magnetic field intensity of a Z-axis magnetoresistive sensor varying with a rotation angle of a non-magnetic rotating disk under a Z-axis unidirectional magnetic field.

As shown in FIG. 8b, it is a diagram of an induced magnetic field intensity of a Z-axis magnetoresistive sensor varying with a rotation angle of a non-magnetic rotating disk under a Z-axis unidirectional magnetic field. As can be seen, in a rotation angle range of 0°-360°, a Z-axis magnetoresistive sensor signal varies periodically at a period of 72°. In this embodiment, it is selected that there are 5 second soft ferromagnetic sectors 4 in the range of 0°-360°, with a span of 72°. Therefore, assuming that a rotation frequency of the non-magnetic rotating disk is f, the frequency of the Z-axis magnetoresistive sensor is 5*f.

Figure 9:
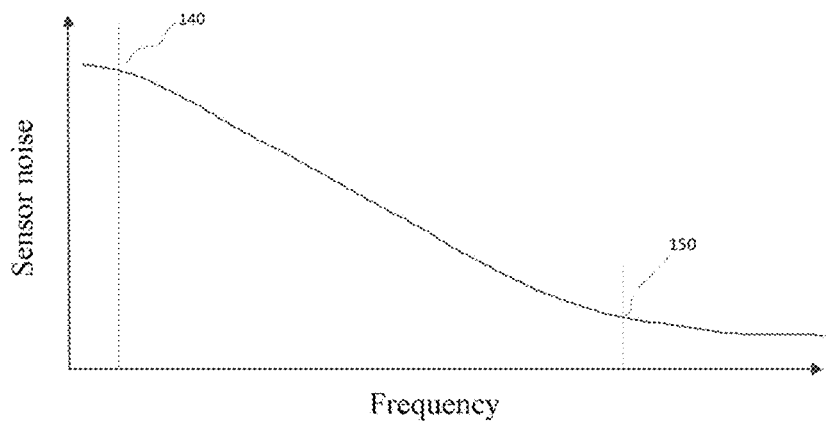
FIG. 9 is a white noise spectrum diagram of a magnetoresistive sensor.

As shown in FIG. 9, it is a white noise spectrum diagram of a magnetoresistive sensor. The white noise has a 1/f feature, that is, the noise of the magnetoresistive sensor is large at a low frequency of 140, while the noise of the magnetoresistive sensor is greatly reduced at a high frequency above 150. Therefore, by introducing a non-magnetic rotating disk and setting 4N first soft ferromagnetic sectors and M second soft ferromagnetic sectors on it, the measurement magnetic fields Hx, Hy, and Hz are modulated to frequencies 4N*f and M*f respectively, so as to reduce the white noise and improve the signal-to-noise ratio.

In the embodiment of the present invention, the type of rotating disk magnetic field probe includes a non-magnetic rotating disk, 4N first soft ferromagnetic sectors, M second soft ferromagnetic sectors, a reference signal generator, and X-axis, Y-axis and Z-axis magnetoresistive sensors. Both the first soft ferromagnetic sectors and the second soft ferromagnetic sectors are located on the non-magnetic rotating disk, and the X-axis, Y-axis and Z-axis magnetoresistive sensors are located above or below the non-magnetic rotating disk. In operation, the non-magnetic rotating disk rotates about a z-axis at a frequency f. An external magnetic field is modulated by the first soft ferromagnetic sector into magnetic field sensed components Hx and Hy having a frequency of 4N×f, and the external magnetic field is further modulated by the second soft ferromagnetic sector into a magnetic field sensed component Hz having a frequency of M×f. The three magnetic field sensed components Hx, Hy, and Hz are converted into output signals by means of the X-axis, Y-axis and Z-axis magnetoresistive sensors, respectively. The reference signal generator respectively outputs a first reference signal having a frequency of 4N×f and a second reference signal having a frequency of M×f. The first reference signal, the second reference signal, and the measurement signals are demodulated by an external processing circuit to output magnetic field values Hx, Hy, and Hz, so as to measure a high signal-to-noise ratio of a three-dimensional magnetic field signal. In the embodiment of the present invention, the type of rotating disk magnetic field probe modulates the static magnetic field into a high-frequency magnetic field, and performs measurement in the high-frequency magnetic field, which can effectively overcome the noise caused by a DC offset of the tunnel magnetoresistance (TMR) magnetoresistive sensor, eliminate the influence of the DC offset, and greatly reduce the noise during use of the TMR magnetoresistive sensor. Moreover, the measurement structure is simple in manufacturing method, which can be realized by adding a rotating soft ferromagnetic probe to the magnetoresistive sensor, thereby reducing the complexity and size of the measurement structure. The measurement structure is valuable for monitoring the geomagnetic field and improving the signal-to-noise ratio.

For example, on the basis of the above technical solution, with reference to FIG. 1 to FIG. 4, the non-magnetic rotating disk 2 optionally has 4N first light incident holes 10 and M second light incident holes 11. Cylindrical coordinates of the 4N first light incident holes 10 are respectively $(r(r=r_{e1}), \alpha(\alpha=\theta \& \theta+90°/N \& \theta+2\times90°/N \ldots \& \theta+(i-1)\times90°/N \ldots \& \theta+(4N-1)\times90°/N), z[z_0, z_0+th_1])$, and cylindrical coordinates of the M second light incident holes 11 are respectively $(r(r=r_{e2}), \alpha(\alpha=\theta_1 \& \theta_1+360°/M \& \theta_1+2\times360°/M \ldots \& \theta_1+(i-1)\times360°/M \ldots \& \theta_1+(M-1)\times360°/M), z[z_0, z_0+th_1])$, where $r_1 < r_{e1}$ and $r_1 < r_{e2}$.

The reference signal generator includes a first light-emitting element 161, a second light-emitting element 162, a first photodetector 14, a second photodetector 15, a first logic trigger circuit, and a second logic trigger circuit. The first light-emitting element 161 is located above or below the first light incident hole 10, the second light-emitting element 162 is located above or below the second light incident hole 11, the first photodetector 14 is located at the other side of the first light incident hole 10 opposite to the first light-emitting element 161, and the second photodetector 15 is located at the other side of the second light incident hole 11 opposite to the second light-emitting element 162.

In operation, the non-magnetic rotating disk 2 rotates about the z-axis at the frequency f. When the first light incident hole 10 and the second light incident hole 11 directly face the first light emitting element 161 and the second light emitting element 162 in turn, the first photodetector 14 triggers the first logic trigger circuit to output a first reference signal having a frequency of 4N×f, and the second photodetector 15 triggers the second logic trigger circuit to output a second reference signal having a frequency of M×f. This embodiment also uses the above accompanying drawings and reference numerals.

In this embodiment, if it is set that N=2, 8 first light incident holes 10 penetrate the upper and lower surfaces of the non-magnetic rotating disk 2, which are respectively 10(1) to 10(8). In an original state, a first light incident hole 10 in a first quadrant of the xy coordinate adjacent to the +X-axis or a first light incident hole 10 overlapped with the +X-axis is marked as 10(1), and the remaining seven light incident holes are marked counterclockwise sequentially as 10(2) to 10(8). It is understandable that with the rotation of the non-magnetic rotating disk 2, 10(1) will rotate to different positions. Cylindrical coordinates of the 8 first light incident holes 10 are respectively $(r(r=r_{e1}), \alpha(\alpha=\theta), z[z_0, z_0+th_1])$, $(r(r=r_{e1}), \alpha(\alpha=\theta+45°), z[z_0, z_0+th_1])$, $(r(r=r_{e1}), \alpha(\alpha=\theta+90°), z[z_0, z_0+th_1])$, $(r(r=r_{e1}), \alpha(\alpha=\theta+135°), z[z_0, z_0+th_1])$, $(r(r=r_{e1}), \alpha(\alpha=\theta+180°), z[z_0, z_0+th_1])$, $(r(r=r_{e1}), \alpha(\alpha=\theta+225°), z[z_0, z_0+th_1])$, $(r(r=r_{e1}), \alpha(\alpha=\theta+270°), z[z_0, z_0+th_1])$, and $(r(r=r_{e1}), \alpha(\alpha=\theta+315°), z[z_0, z_0+th_1])$.

In this embodiment, if it is set that M=5, 5 second light incident holes 11 penetrate the upper and lower surfaces of the non-magnetic rotating disk 2, which are respectively 11(1) to 11(5). In an original state, a second light incident hole 11 in a first quadrant of the xy coordinate adjacent to the +X-axis or a second light incident hole 11 overlapped with the +X-axis are marked as 11(1), and the remaining four light incident holes are marked counterclockwise sequentially as 11(2) to 11(5). It is understandable that with the rotation of the non-magnetic rotating disk 2, 11(1) will rotate to different positions. Cylindrical coordinates of the 5 second light incident holes 11 are respectively $(r(r=r_{e2}), \alpha(\alpha=\theta_1), z[z_0, z_0+th_1])$, $(r(r=r_{e2}), \alpha(\alpha=\theta_1+72°), z[z_0, z_0+th_1])$, $(r(r=r_{e2}), \alpha(\alpha=\theta_1+144°), z[z_0, z_0+th_1])$, $(r(r=r_{e2}), \alpha(\alpha=\theta_1+216°), z[z_0, z_0+th_1])$, and $(r(r=r_{e2}), \alpha(\alpha=\theta_1+288°), z[z_0, z_0+th_1])$.

In this embodiment, the reference signal generator includes two light-emitting elements and two photodetectors, which are respectively the first light-emitting element 161 and the second light-emitting element 162, and the first photodetector 14 and the second photodetector 15. The light-emitting elements and the photodetectors are respectively located on both sides of the non-magnetic rotating disk 2, so that the photodetectors may detect the light emitted by the light-emitting elements through the light incident holes. Optionally, the photodetectors and the magnetoresistive sensors are located on the same side of the non-magnetic rotating disk 2.

As shown in FIG. 2, optionally, the first light-emitting element 161 is located above the first light incident hole 10, the second light-emitting element 162 is located above the second light incident hole 11, the first photodetector 14 is located below the first light incident hole 10, and the second photodetector 15 is located below the second light incident hole 11. In other embodiments, as shown in FIG. 3, it is also optional that the first light-emitting element 161 is located below the first light incident hole 10, the second light-emitting element 162 is located below the second light incident hole 11, the first photodetector 14 is located above the first light incident hole 10, and the second photodetector 15 is located above the second light incident hole 11. Optionally, the light-emitting elements are LED lights or any other applicable light-emitting elements. It is understandable that the positions of the light-emitting elements and the photodetectors are fixed after being determined.

In operation, the rotating shaft 12 rotates at the frequency f to synchronously drive the non-magnetic rotating disk 2 to rotate about the z-axis at the frequency f, so that the positions of the light incident holes on the non-magnetic rotating disk 2 rotate. When the first light incident hole 10 and the second light incident hole 11 are rotated to directly face the first light-emitting element 161 and the second light-emitting element 162 in turn, the first photodetector 14 located below the first light incident hole 10 may detect the light emitted by the first light-emitting element 161, then the first photodetector 14 triggers the first logic trigger circuit to output the first reference signal having the frequency of 4N×f; the second photodetector 15 located below the second light incident hole 11 may detect the light emitted by the second light-emitting element 162, then the second photodetector 15 triggers the second logic trigger circuit to output the second reference signal having the frequency of M×f.

Optionally, the first reference signal and the second reference signal are both high-level or low-level signals. Before the first photodetector detects the light emitted by the first light-emitting element, the level of the first logic trigger circuit remains unchanged, and after the first photodetector detects the light emitted by the first light-emitting element, the level of the first logic trigger circuit is converted. Before the second photodetector detects the light emitted by the second light-emitting element, the level of the second logic trigger circuit remains unchanged, and after the second photodetector detects the light emitted by the second light-emitting element, the level of the second logic trigger circuit is converted.

It is understandable that if the non-magnetic rotating disk 2 is rotated to the first light-emitting element 161 and the first light incident hole 10 and the first photodetector 14 are set face to face, the first photodetector 14 can detect the light of the first light-emitting element 151 and trigger the first logic trigger circuit, and the first logic trigger circuit switches the level of the output first reference signal. If the non-magnetic rotating disk 2 is rotated to the first light-emitting element 161 and the first light incident hole 10 is interlaced with the first photodetector 14, the first photodetector 14 cannot detect the light of the first light-emitting element 161, and the first logic trigger circuit keeps the level of the first reference signal unchanged. The switching process of the second reference signal is identical to that of the first reference signal and will not be repeated here.

Specifically, in operation, the non-magnetic rotating disk 2 rotates about the z-axis at the frequency f, and the position of the light incident hole varies. When the first light incident hole 10(1) directly faces the first light-emitting element 161, the first photodetector 14 detects the light of the first light-emitting element 161 and converts the light signal into an electrical signal, so as to detect an angular displacement of the non-magnetic rotating disk 2, and trigger the first logic trigger circuit to output the first reference signal having the frequency of 4N×f. Optionally, the level of the first reference signal may be a high level, and the output is maintained. Sequentially, when the first light incident hole 10(2) directly faces the first light-emitting element 161, the first photodetector 14 detects the light of the first light-emitting element 161 and converts the light signal into an electrical signal, so as to detect an angular displacement of the non-magnetic rotating disk 2, and trigger the first logical contact circuit to switch the level of the first reference signal. At this time, the first reference signal is switched from the high level to a low level having the frequency of 4N×f, and the output is maintained. By analogy, when the first light incident hole 10 directly faces the first light-emitting element 161, the first photodetector 14 triggers the first logic trigger circuit to switch the level of the first reference signal. When the first light incident hole 10 is interlaced with the first light-emitting element 161, the level of the first reference signal output by the first logic trigger circuit remains unchanged. As can be seen, the first logic trigger circuit outputs the first reference signal composed of a high level and a low level and having the frequency of 4N×f.

Similarly, based on the second light-emitting element 162, the second light incident hole 11, and the second photodetector 15, the second logic trigger circuit outputs the second reference signal composed of a high level and a low level and having the frequency of M×f.

Optionally, the first photodetector 14, the second photodetector 15, the X-axis magnetoresistive sensors 7 and 8, the Y-axis magnetoresistive sensors 5 and 6, and the Z-axis magnetoresistive sensor 9 are located on the same circuit board 13. It is understandable that the photodetectors, the magnetoresistive sensors, the logic trigger circuits, and other structures are all located on the same circuit board 13. The logic trigger circuit is electrically connected to the corresponding photodetector, but the cylindrical coordinates of the logic trigger circuit are not specifically limited.

For example, on the basis of the above technical solution, optionally, the reference signal generator includes an analog angular transducer and a frequency multiplier. The analog angular transducer monitors the rotation of the non-magnetic rotating disk and outputs a sine or cosine periodic signal that varies with the angle, and then outputs the first reference signal having the frequency of 4N×f and the second reference signal having the frequency of M×f respectively through the frequency multiplier. Different from the above embodiments, the reference signal generator in this embodiment may be arranged on the rotating shaft. The reference signal generator includes the analog angular transducer, and the analog angular transducer may be used for detecting the rotation of the rotating shaft and outputting a sine or cosine signal having a frequency of f according to the rotation angle of the rotating shaft. The reference signal generator further includes the frequency multiplier, and the sine or cosine signal having the frequency of f passes through the frequency multiplier to respectively generate the first reference signal having the frequency of 4N×f and the second reference signal having the frequency of M×f.

For example, on the basis of the above technical solution, optionally, the X-axis magnetoresistive sensor, the Y-axis magnetoresistive sensor, and the Z-axis magnetoresistive sensor are all linear tunnel magnetoresistive sensors.

Figure 10:
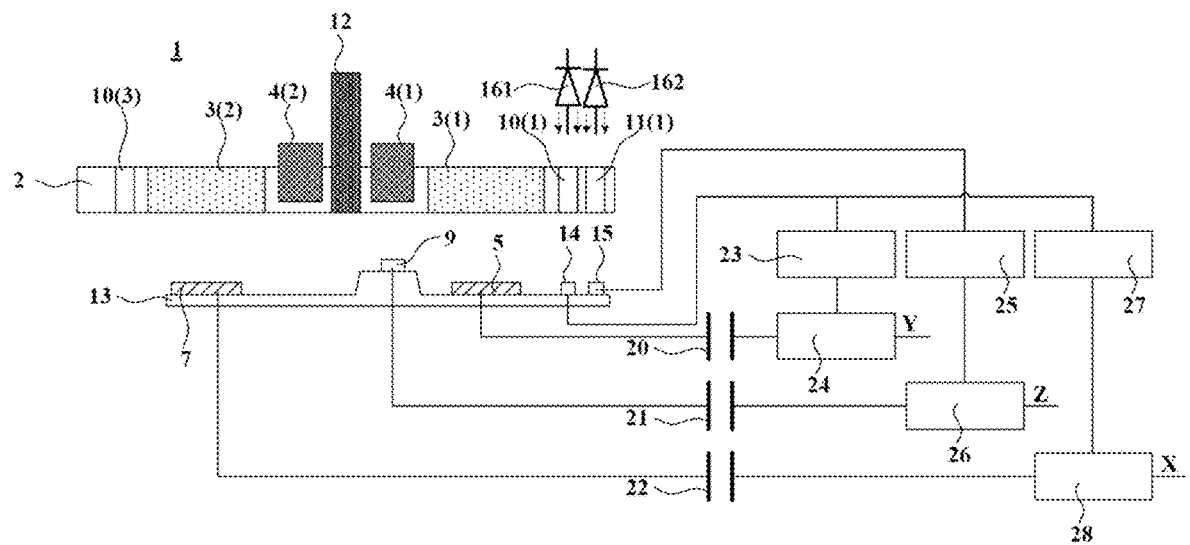
FIG. 10 is a schematic structural diagram of an external processing circuit.

Optionally, the external processing circuit as shown in FIG. 10 includes a first phase-locked circuit 24, a second phase-locked circuit 28, and a third phase-locked circuit 26. The measurement signals of the Y-axis magnetoresistive sensors 5 and 6 are coupled and output to the first phase-locked circuit 24 through a first capacitor 20, the measurement signals of the X-axis magnetoresistive sensors 7 and 8 are coupled and output to the second phase-locked circuit 28 through a second capacitor 22, and the measurement signal of the Z-axis magnetoresistive sensor 9 is coupled and output to the third phase-locked circuit 26 through a third capacitor 21. The phase-locked circuits each include a mixer and a low-pass filter. Cut-off frequencies of the low-pass filters of the first phase-locked circuit 24 and the second phase-locked circuit 28 are all less than 4N×f, and a cut-off frequency of the low-pass filter of the third phase-locked circuit 26 is less than M×f.

Figure 11:
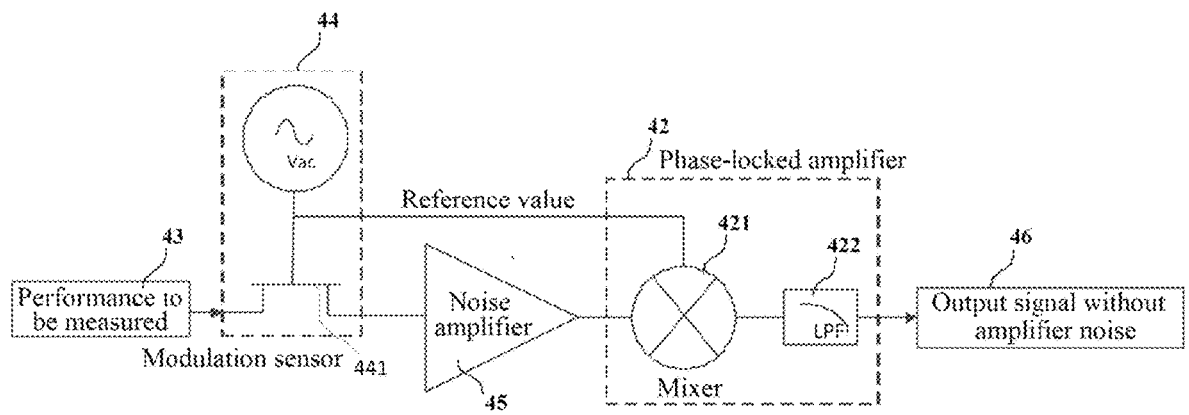
FIG. 11 is a schematic structural diagram of an external processing circuit.

Optionally, the external processing circuit further includes a pre-amplifier, and the pre-amplifier is arranged between the capacitor and the phase-locked circuit. As shown in FIG. 11, a physical quantity 43 to be measured, that is, the measurement signal is formed by a modulation sensor 44 into a signal having a frequency of f, including a high-frequency carrier signal source Vac and its corresponding sensor 441. The phase-locked circuit 42 may optionally be a phase-locked amplifier or a phase-locked loop, including a mixer 421 and a low-pass filter 422. The modulated signal output by the modulation sensor 44 is amplified by a noise amplifier 45 to obtain a signal having a signal frequency of f. The noise amplifier 45 is a pre-amplifier. Then, the high-frequency carrier signal source Vac directly outputs a reference signal having a frequency the same as that of the signal having the frequency of f, and the frequency signal is input to the mixer 421. After mixing, a high-frequency signal and a low-frequency signal are obtained, and then the low-frequency part is removed through the low-pass filter 422. The noise signal will not have frequency shift; therefore, the noise of the amplifier 45 is also filtered out, and finally a high-frequency output signal 46 without the amplifier noise is obtained.

As shown in FIG. 10, optionally, the first reference signal is respectively connected to the first phase-locked circuit 24 and the second phase-locked circuit 28. The first phase-locked circuit 24 outputs a Vy signal corresponding to the Y-axis magnetic field component of the external magnetic field H, and the second phase-locked circuit 28 outputs a Vx signal corresponding to the X-axis magnetic field component of the external magnetic field H. The second reference signal is connected to the third phase-locked circuit 26, and the third phase-locked circuit 26 outputs a Vz signal corresponding to the Z-axis magnetic field component of the external magnetic field H. Optionally, the phase-locked circuit is the phase-locked amplifier shown in the figure.

As described above, the first light incident hole 10(1) is irradiated by the first light-emitting element 161, and the first photodetector 14 converts the frequency f of the rotation of the non-magnetic rotating disk 2 into the first reference signal having the frequency of 4N×f. The second light incident hole 11(1) is irradiated by the second light-emitting element 162, and the second photodetector 15 converts the frequency f of the rotation of the non-magnetic rotating disk 2 into the second reference signal having the frequency of M×f. The first reference signal is transmitted to the trigger 23 and the trigger 27 respectively, then input to a reference signal input end of the phase-locked amplifier 24 through the trigger 23, for obtaining the measurement signal of the corresponding Y-axis magnetoresistive sensor subsequently, and input to a reference signal input end of the phase-locked amplifier 28 through the trigger 27, for obtaining the measurement signal of the corresponding X-axis magnetoresistive sensor subsequently. The second reference signal is transmitted to the trigger 25, and input to a reference signal input terminal of the phase-locked amplifier 26 through the trigger 25, for obtaining the measurement signal of the corresponding Z-axis magnetoresistive sensor subsequently.

On the other hand, the magnetic field sensed components Hx, Hy, and Hz received by the X-axis magnetoresistive sensor 7, the Y-axis magnetoresistive sensor 5, and the Z-axis magnetoresistive sensor 9 are converted to electrical signals respectively having a frequency of 4N×f, 4N×f, and M×f, and the electrical signals are input to the measurement signal input terminals of the phase-locked amplifiers 24, 26, and 28 after passing through the coupling capacitors, namely, the first capacitor 20, the second capacitor 22, and the third capacitor 21. In this way, the phase-locked amplifier 24 obtains the output signal Vy of the Y-axis magnetic field component according to the first reference signal output by the trigger 23 and the Y-axis measurement signal of the Y-axis magnetoresistive sensor 5. The phase-locked amplifier 28 obtains the output signal Vx of the X-axis magnetic field component according to the first reference signal output by the trigger 27 and the X-axis measurement signal of the X-axis magnetoresistive sensor 7. The phase-locked amplifier 26 obtains the output signal of the Z-axis magnetic field component according to the second reference signal output by the trigger 25 and the Z-axis measurement signal of the Z-axis magnetoresistive sensor, so as to finally obtain vector values of the external magnetic field.

The reference signals corresponding to the phase-locked amplifiers 24, 26, and 28 are in pulse form. The optical signals received by the photodetectors 14 and 15 are used for exciting the triggers 23, 25, and 27, and then outputting a high level and a low level respectively. Each time the photodetector receives an LED incident light, it will trigger the inversion of the high level and the low level. That is, the low level is output at the beginning, and before the LED incident light is received, the low level is maintained. After the LED incident light is received, the low level is switched to the high level and the high level is maintained until the next LED incident light is received, and it will change from the high level to the low level again.

Figure 12:
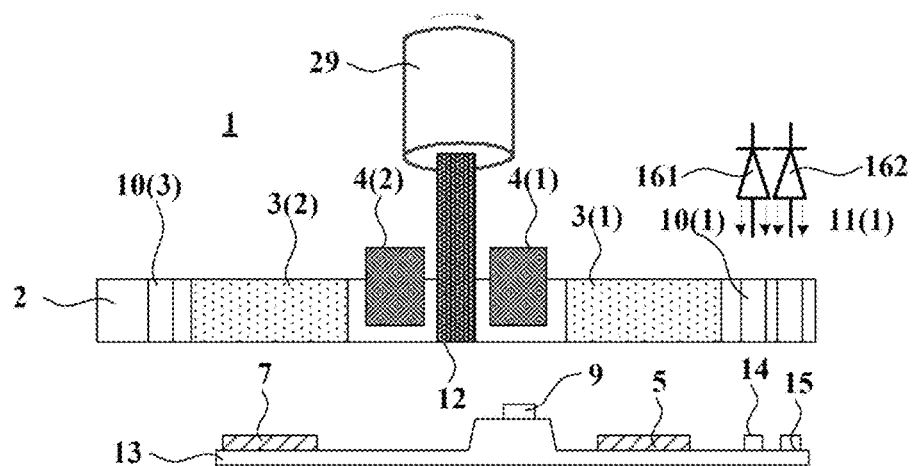
FIG. 12 is a schematic diagram of a driving structure of a non-magnetic rotating disk.
Figure 13:
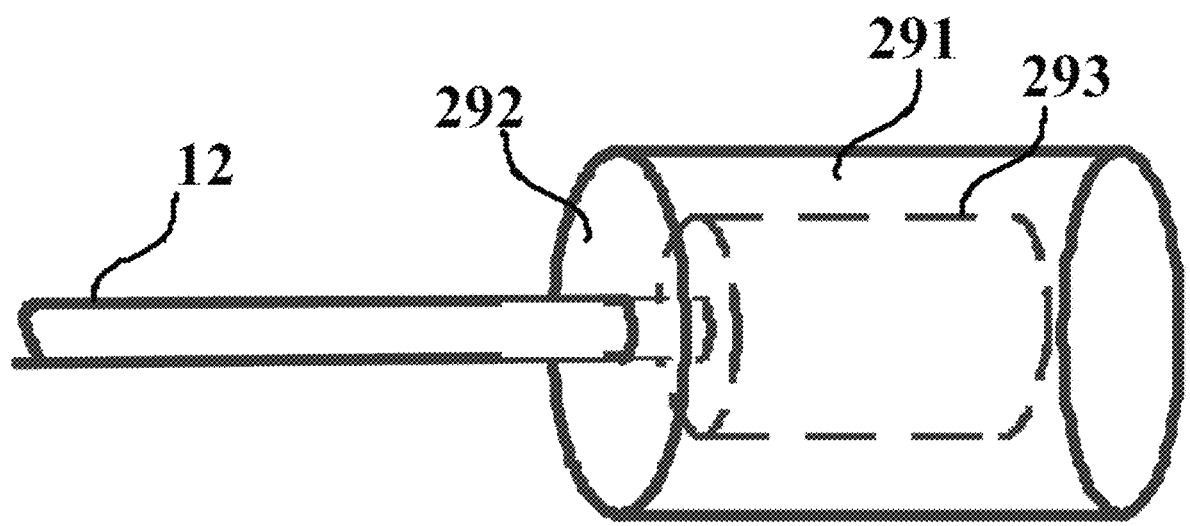
FIG. 13 is a schematic structural diagram of a magnetically shielded motor.

For example, on the basis of the above technical solution, as shown in FIG. 12 and FIG. 13, optionally, the non-magnetic rotating disk 2 is driven by a magnetically shielded motor 29 to generate rotation, the non-magnetic rotating disk 2 is connected to the magnetically shielded motor 29 through the non-magnetic transmission shaft 12, the surface of the magnetically shielded motor 29 is covered with a metal conductive layer 291, and one side of the magnetically shielded motor 291 close to the non-magnetic rotating disk 2 is covered with a soft ferromagnetic metal layer 292 for magnetic shielding. Optionally, the first soft ferromagnetic sectors 3, the second soft ferromagnetic sectors 4, and the soft ferromagnetic metal layer 292 are all made of soft ferromagnetic alloy materials.

In this embodiment, the magnetically shielded motor 29 drives the non-magnetic rotating disk 2 to rotate through the non-magnetic transmission shaft, that is, the rotating shaft 12. The magnetically shielded motor 29 includes a motor 293 and the rotating shaft 12 connecting the motor 293 and the non-magnetic rotating disk 2, and further includes the metal conductive shielding layer 291 wrapped on the surface of the motor 293, wherein one side close to the non-magnetic rotating disk 2 is further attached with a soft ferromagnetic metal layer 292. The non-magnetic rotating disk 2 is made of a non-magnetic material, including plastic, ceramic, metal, and polymer. The first soft ferromagnetic sectors, the second soft ferromagnetic sectors, and the soft ferromagnetic metal layer are all made of soft ferromagnetic alloy materials, that is, high permeability soft ferromagnetic materials consisting of Co, Fe, Ni and B, Si, C, and transition metals Nb, Cu, and Zr. The soft ferromagnetic metal shielding layer 292 is used for shielding the rotating magnetic field of the motor 293 to avoid affecting the non-magnetic rotating disk 2.

It should be noted that the above are only preferred embodiments of the present disclosure and applied technical principles. Those skilled in the art will understand that the present disclosure is not limited to the specific embodiments described herein, and various obvious changes, readjustments, combinations, and substitutions can be made by those skilled in the art without departing from the protection scope of the present disclosure. Therefore, although the present disclosure has been described in detail through the above embodiments, the present disclosure is not limited to the above embodiments, and can also include more other equivalent embodiments without departing from the concept of the present disclosure. The scope of the present disclosure is defined by the scope of the appended claims.

The invention claimed is:

1. A type of rotating disk magnetic field probe, comprising:
 a non-magnetic rotating disk, 4N first soft ferromagnetic sectors, and M second soft ferromagnetic sectors, wherein both the first soft ferromagnetic sectors and the second soft ferromagnetic sectors are located on the non-magnetic rotating disk, cylindrical coordinates of the 4N first soft ferromagnetic sectors are respectively $(r[r_1,r_2]$, $\alpha[\Phi_0, 90°/N-\Phi_0]$, $z[z_0,z_0+th_1])$, $(r[r_1,r_2]$, $\alpha[\Phi_0+90°/N, 2\times90°/N-\Phi_0]$, $z[z_0,z_0+th_1])$, $(r[r_1,r_2]$, $\alpha[\Phi_0+(i-1)\times90°/N, i\times90°/N-\Phi_0]$, $z[z_0,z_0+th_1])$ and $(r[r_1,r_2]$, $\alpha[\Phi_0+(4N-1)\times90°/N, 4N\times90°/N-\Phi_0]$, $z[z_0,z_0+th_1])$, and cylindrical coordinates of the M second soft ferromagnetic sectors are respectively $(r[r_3,r_4]$, $\alpha[\Phi_1, 360°/M-\Phi_1]$, $z[z_1,z_1+th_3])$, $(r[r_3,r_4]$, $\alpha[\Phi_1+360°/M, 2\times360°/M-\Phi_1]$, $z[z_1,z_1+th_3])$, $(r[r_3,r_4]$, $\alpha[\Phi_1+(i-1)\times360°/M, i\times360°/M-\Phi_1]$, $z[z_1,z_1+th_3])$ and $(r[r_3,r_4]$, $\alpha[\Phi_1+(M-1)\times360°/M, M\times360°/M-\Phi_1]$, $z[z_1,z_1+th_3])$;

a Y-axis magnetoresistive sensor at cylindrical coordinates $(r(r=(r_1+r_2)/2)$, $\alpha(\alpha=0°\&180°)$, $z[(z=z_0-th_2)|(z=z_0+th_1+th_2)])$;

an X-axis magnetoresistive sensor at cylindrical coordinates $(r(r=(r_1+r_2)/2)$, $\alpha(\alpha=90°\&270°)$, $z[(z=z_0-th_2)|(z=z_0+th_1+th_2)])$;

a Z-axis magnetoresistive sensor at cylindrical coordinates $(r(r=(r_3+r_4)/2)$, $\alpha[(\alpha=180°/M)|(\alpha=3\times180°/M)|\ldots|(\alpha=(2i-1)\times180°/M)|\ldots|(\alpha=(2M-1)\times360°/M)|(\alpha=(M-1)\times360°/M)]$, $z[(z=z_1-th_4)|(z=z_1+th_3+th_4)])$;

and a reference signal generator, wherein both 4N/M and M/4N are non-integers;

in operation, the non-magnetic rotating disk rotates about a z-axis at a frequency f, an external magnetic field H is modulated by the first soft ferromagnetic sector into magnetic field sensed components Hx and Hy having a frequency of 4N×f, the external magnetic field H is further modulated by the second soft ferromagnetic sector into a magnetic field sensed component Hz having a frequency of M×f, the three magnetic field sensed components Hx, Hy, and Hz are converted into output signals by means of the X-axis, Y-axis and Z-axis magnetoresistive sensors, respectively, the reference signal generator respectively outputs a first reference signal having a frequency of 4N×f and a second reference signal having a frequency of M×f, and the first reference signal, the second reference signal, and the measurement signals are demodulated by an external processing circuit to output magnetic field values Hx, Hy, and Hz, so as to measure a high signal-to-noise ratio of a three-dimensional magnetic field signal.

2. The type of rotating disk magnetic field probe according to claim 1, wherein the non-magnetic rotating disk has 4N first light incident holes and M second light incident holes, cylindrical coordinates of the 4N first light incident holes are respectively $(r(r=r_{e1})$, $\alpha(\alpha=\theta\&\theta+90°/N\&\theta+2\times90°/N\ldots\&\theta+(i-1)\times90°/N\ldots\&\theta+(4N-1)\times90°/N)$, $z[z_0,z_0+th_1])$, and cylindrical coordinates of the M second light incident holes are respectively $(r(r=r_{e2})$, $\alpha(\alpha=\theta_1\&\theta_1+360°/M\&\theta_1+2\times360°/M\ldots\&\theta_1+(i-1)\times360°/M\ldots\&\theta_1+(M-1)\times360°/M)$, $z[z_0,z_0+th_1])$, wherein $r_1<r_{e1}$ and $r_1<r_{e2}$;

the reference signal generator comprises a first light-emitting element, a second light-emitting element, a first photodetector, a second photodetector, a first logic trigger circuit, and a second logic trigger circuit, the first light-emitting element is located above or below the first light incident hole, the second light-emitting element is located above or below the second light incident hole, the first photodetector is located at the other side of the first light incident hole opposite to the first light-emitting element, and the second photodetector is located at the other side of the second light incident hole opposite to the second light-emitting element; and in operation, the non-magnetic rotating disk rotates about the z-axis at the frequency f, when the first light incident hole and the second light incident hole directly face the first light-emitting element and the second light-emitting element in turn, the first photodetector triggers the first logic trigger circuit to output the first reference signal having the frequency of 4N×f and the second photodetector triggers the second logic trigger circuit to output the second reference signal having the frequency of M×f.

3. The type of rotating disk magnetic field probe according to claim 2, wherein the first reference signal and the second reference signal are both high-level or low-level signals;

before the first photodetector detects light emitted by the first light-emitting element, a level of the first logic trigger circuit remains unchanged, and after the first photodetector detects the light emitted by the first light-emitting element, the level of the first logic trigger circuit is converted; and before the second photodetector detects light emitted by the second light-emitting element, a level of the second logic trigger circuit remains unchanged, and after the second photodetector detects the light emitted by the second light-emitting element, the level of the second logic trigger circuit is converted.

4. The type of rotating disk magnetic field probe according to claim 2, wherein the first photodetector, the second photodetector, the X-axis magnetoresistive sensor, the Y-axis magnetoresistive sensor, and the Z-axis magnetoresistive sensor are located on the same circuit board.

5. The type of rotating disk magnetic field probe according to claim 1, wherein the reference signal generator comprises an analog angular transducer and a frequency multiplier;

the analog angular transducer monitors the rotation of the non-magnetic rotating disk, outputs a sine or cosine periodic signal that varies with the angle, and then outputs the first reference signal having the frequency of 4N×f and the second reference signal having the frequency of M×f by the frequency multiplier.

6. The type of rotating disk magnetic field probe according to claim 1, wherein the X-axis magnetoresistive sensor, the Y-axis magnetoresistive sensor, and the Z-axis magnetoresistive sensor are all linear tunnel magnetoresistive sensors.

7. The type of rotating disk magnetic field probe according to claim 6, wherein the external processing circuit comprises a first phase-locked circuit, a second phase-locked circuit, and a third phase-locked circuit;

the measurement signal of the Y-axis magnetoresistive sensor is coupled and output to the first phase-locked circuit through a first capacitor, the measurement signal of the X-axis magnetoresistive sensor is coupled and output to the second phase-locked circuit through a second capacitor, and the measurement signal of the Z-axis magnetoresistive sensor is coupled and output to the third phase-locked circuit through a third capacitor, wherein the phase-locked circuits each comprise a mixer and low-pass filter, cut-off frequencies of the low-pass filters of the first phase-locked circuit and the second phase-locked circuit are both less than 4N×f, and a cut-off frequency of the low-pass filter of the third phase-locked circuit is less than M×f.

8. The type of rotating disk magnetic field probe according to claim 7, wherein the external processing circuit further comprises a pre-amplifier, and the pre-amplifier is arranged between the capacitor and the phase-locked circuit.

9. The type of rotating disk magnetic field probe according to claim 7, wherein the first reference signal is respectively connected to the first phase-locked circuit and the second phase-locked circuit, the first phase-locked circuit outputs a Vy signal corresponding to the Y-axis magnetic field component of the external magnetic field H, and the second phase-locked circuit outputs a Vx signal corresponding to the X-axis magnetic field component of the external magnetic field H; and the second reference signal is connected to the third phase-locked circuit, and the third phase-locked circuit outputs a Vz signal corresponding to the Z-axis magnetic field component of the external magnetic field H.

10. The type of rotating disk magnetic field probe according to claim 1, wherein the non-magnetic rotating disk is driven to rotate by a magnetically shielded motor, the non-magnetic rotating disk is connected to the magnetically shielded motor through a non-magnetic transmission shaft, the surface of the magnetically shielded motor is covered with a metal conductive layer, and one side of the magnetically shielded motor close to the non-magnetic rotating disk is covered with a soft ferromagnetic metal layer for magnetic shielding.

11. The type of rotating disk magnetic field probe according to claim 10, wherein the first soft ferromagnetic sectors, the second soft ferromagnetic sectors, and the soft ferromagnetic metal layer are all made of soft ferromagnetic alloy materials.

12. The type of rotating disk magnetic field probe according to claim 1, wherein: the X-axis magnetoresistive sensor, the Y-axis magnetoresistive sensor, and the Z-axis magnetoresistive sensor are all linear tunnel magnetoresistive sensors;

the external processing circuit comprises a first phase-locked circuit, a second phase-locked circuit, and a third phase-locked circuit;

the measurement signal of the Y-axis magnetoresistive sensor is coupled and output to the first phase-locked circuit through a first capacitor, the measurement signal of the X-axis magnetoresistive sensor is coupled and output to the second phase-locked circuit through a second capacitor, and the measurement signal of the Z-axis magnetoresistive sensor is coupled and output to the third phase-locked circuit through a third capacitor, wherein the phase-locked circuits each comprise a mixer and low-pass filter, cut-off frequencies of the low-pass filters of the first phase-locked circuit and the second phase-locked circuit are both less than 4N×f, and a cut-off frequency of the low-pass filter of the third phase-locked circuit is less than M×f;

the external processing circuit further comprises a pre-amplifier, and the pre-amplifier is arranged between the capacitor and the phase-locked circuit;

the first reference signal is respectively connected to the first phase-locked circuit and the second phase-locked circuit, the first phase-locked circuit outputs a Vy signal corresponding to the Y-axis magnetic field component of the external magnetic field H, and the second phase-locked circuit outputs a Vx signal corresponding to the X-axis magnetic field component of the external magnetic field H; and the second reference signal is connected to the third phase-locked circuit, and the third phase-locked circuit outputs a Vz signal corresponding to the Z-axis magnetic field component of the external magnetic field H.

* * * * *